(12) United States Patent
Kou

(10) Patent No.: US 6,600,314 B2
(45) Date of Patent: Jul. 29, 2003

(54) TUNNELING MAGNETORESISTIVE EFFECT DEVICE AND DIRECTION SENSOR SYSTEM USING SAID DEVICE

(75) Inventor: Futoyoshi Kou, Natori (JP)

(73) Assignees: Ricoh Company, Ltd., Tokyo (JP); Tohoku Ricoh Co., Ltd., Shibata-gun (JP)

( * ) Notice: Subject to any disclaimer, the term of this patent is extended or adjusted under 35 U.S.C. 154(b) by 0 days.

(21) Appl. No.: 10/173,803

(22) Filed: Jun. 19, 2002

(65) Prior Publication Data

US 2003/0006764 A1 Jan. 9, 2003

(30) Foreign Application Priority Data

Jun. 20, 2001 (JP) .......................... 2001-185843

(51) Int. Cl.$^7$ .................. G01R 33/09; H01L 43/08; G11B 5/39
(52) U.S. Cl. .................. 324/252; 324/247; 33/355 R; 338/32 R; 360/324.2; 428/900
(58) Field of Search ................ 324/247, 252; 338/32 R; 360/324.2; 33/355 R, 363 R; 365/158, 171, 173; 428/611, 692, 693, 900

(56) References Cited

U.S. PATENT DOCUMENTS 5,519,318 A * 5/1996 Koerner et al. .......... 324/252
5,729,129 A * 3/1998 Acker ..................... 324/247 X
6,329,078 B1 * 12/2001 Tsuge ..................... 428/678
6,469,879 B1 * 10/2002 Redon et al. ............ 360/324.2
6,473,257 B1 * 10/2002 Shimazawa et al. . 360/324.2 X
6,483,675 B1 * 11/2002 Araki et al. ............. 360/324.2

FOREIGN PATENT DOCUMENTS

JP   2000-150985   5/2000

* cited by examiner

*Primary Examiner*—Gerard R. Strecker
(74) *Attorney, Agent, or Firm*—Oblon, Spivak, McClelland, Maier & Neustadt, P.C.

(57) ABSTRACT

The present invention provides a highly sensitive TMR device. Since a TMR device is normally manufactured by a thin-film formation technique, the size and weight can be reduced. The thickness of a first spin polarization layer that is stacked on a soft magnetic layer for assisting magnetic field sensing operations and has a higher coercive force and a higher spin polarization rate than the soft magnetic layer is adjusted to a value that is smaller than the thickness of a tunneling layer or smaller than 2 nm, whichever is smaller. With the first spin polarization layer having such a thickness, both a low coercive force and a desirable TMR rate can be obtained. As a result, the magnetic field sensitivity of the TMR device as a sensor can be increased.

15 Claims, 11 Drawing Sheets

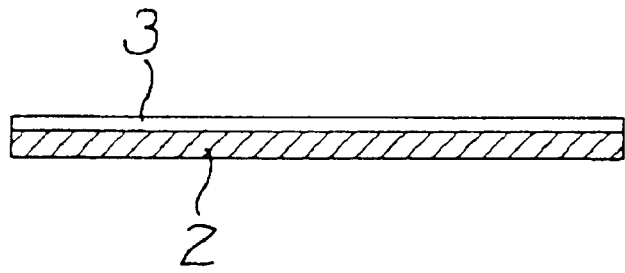
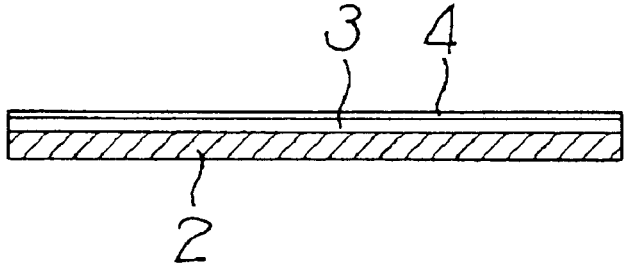
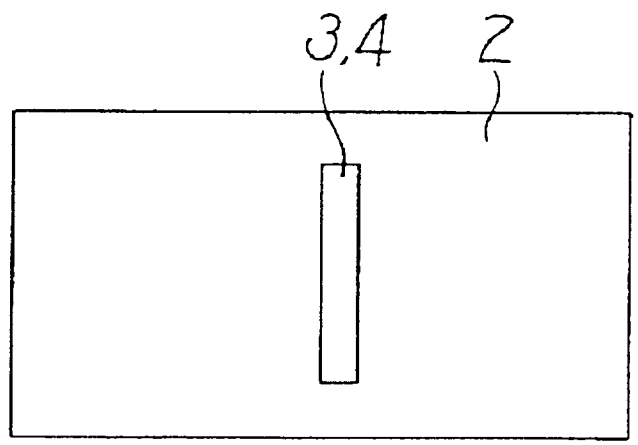
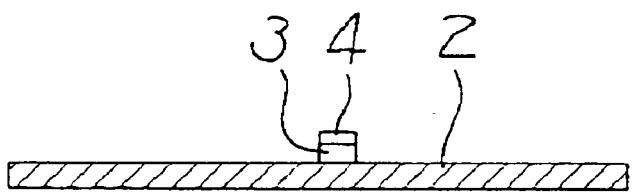

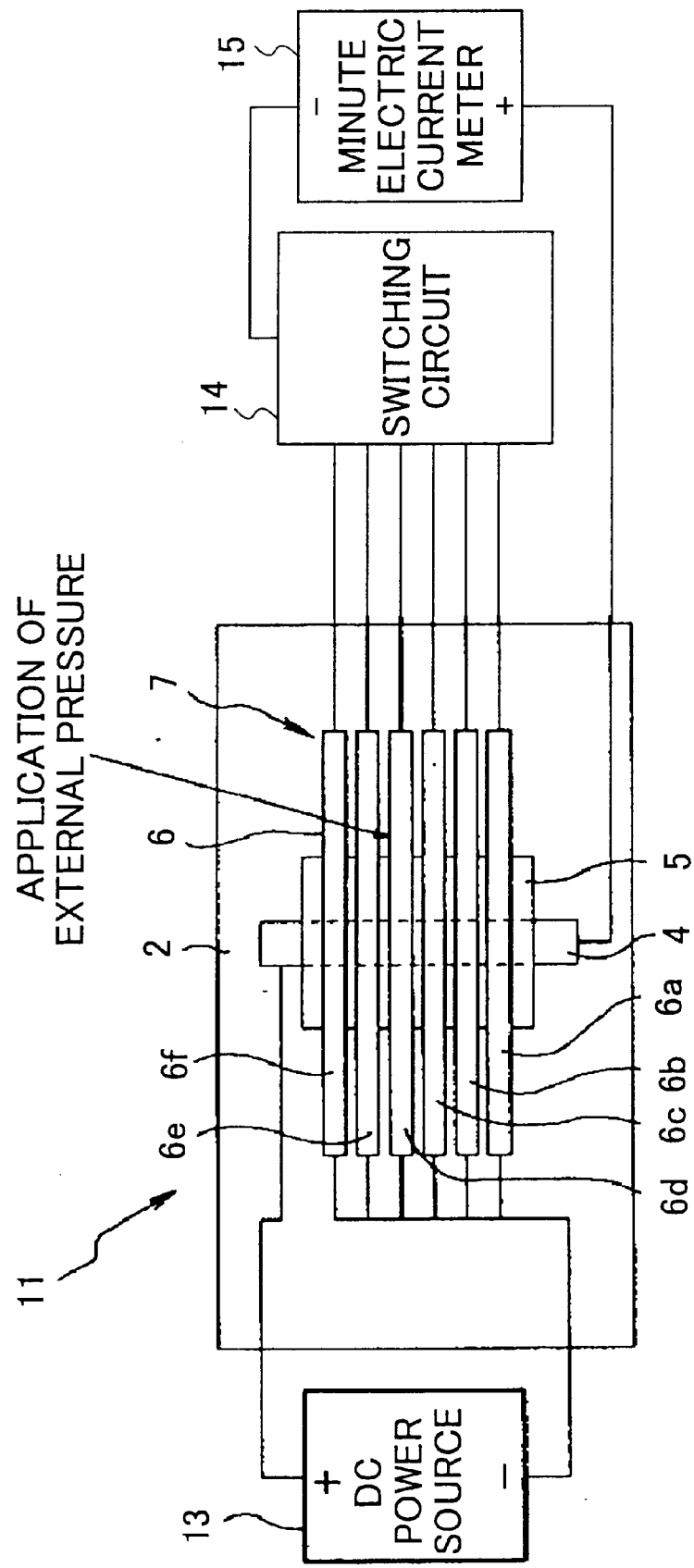

TUNNELING MAGNETORESISTIVE EFFECT DEVICE AND DIRECTION SENSOR SYSTEM USING SAID DEVICE

BACKGROUND OF THE INVENTION

1. Field of the Invention

The present invention relates to a tunneling magnetoresistive effect device, such as a geomagnetism sensor for magnetic field measurement or navigation, and a direction sensor system using the device.

2. Description of the Related Art

Examples of conventional magnetism sensors include magnetoresistive effect devices (MR devices), magnetism impedance devices (MI devices), flux gate sensors, and semiconductor Hall effect sensors. Among these sensors, MI devices, which have been developed only recently, can constitute thin-film and small-sized MI sensors, and therefore are expected to be improved even further. An MI device can also sense a magnetic field strength from a change in the magnetic field of high-frequency impedance, when high-frequency electric current is applied to the MI device.

In addition to those magnetism sensors, tunneling magnetoresistive effect devices (TMR devices) have been recently developed. A TMR device has a plurality of magnetic thin-film layers, with an insulating layer being interposed in between. In such a TMR device, electrons are transmitted through the insulating layer by a tunneling effect, while maintaining the spin. Here, a magnetic field is sensed based on the tunnel permeability coefficient that is changed with the magnetized state affected by the tunneling effect. Having a very high magnetic field sensitivity, a ferromagnetic tunneling effect can be effectively used in a HDD magnetic reproducing head for reproducing very high-density magnetic recording media. Also, such a ferromagnetic tunneling effect can be used in a magnetic field measuring device for motors, a magnetism sensor such as a geomagnetism sensor for navigation, or a magnetic solid-state memory device that is generally referred to as MRAM.

Japanese Laid-Open Patent Application No. 11-161919 (Japanese Patent No. 3004005) discloses such a TMR device that achieves an improved magnetostatic interactive operation.

Japanese Laid-Open Patent Application No. 5-157566 discloses a general MR device that is used in a direction indicator. To realize a higher magnetic field sensitivity and hysteresis, an auxiliary magnetic field is generated in the MR device.

In Japanese Laid-Open Patent Application No. 11-161919 (Japanese Patent No. 3004005), however, the magnetostatic interactive operation is improved by the lamination structure of the layers, which is not an essential solution and leads to higher production costs.

Also, to produce a direction sensor, it is not desirable to increase the sensitivity by generating an auxiliary magnetic field in an MR device.

In view of these facts, the conventional magnetism sensors are not effective enough in terms of size, weight, costs, and sensitivity, and should be further improved.

SUMMARY OF THE INVENTION

An object of the present invention is to provide a tunneling magnetoresistive effect device that is small and light, and has a high sensitivity.

Another object of the present invention is to provide a direction sensor system that can increase the precision in sensing geomagnetism by virtue of the above tunneling magnetoresistive effect device, and can be effectively used in a navigation system or the like.

The above objects of the present invention are achieved by a tunneling magnetoresistive effect device that includes: a soft magnetic layer for assisting magnetic field sensing operations, the soft magnetic layer being stacked on a surface of a substrate; a first spin polarization layer that is stacked on the soft magnetic layer, and has a higher coercive force and a higher spin polarization rate than the soft magnetic layer; a tunneling layer that covers the soft magnetic layer and the first spin polarization layer, and is made of an insulating material or a dielectric material; and a second spin polarization layer that is stacked on the tunneling layer, and corresponds to the first spin polarization layer. In this tunneling magnetoresistive effect device, a magnetism sensing unit is formed by the lamination structure consisting of the soft magnetic layer, the first spin polarization layer, the tunneling layer, and the second spin polarization layer. The thickness of the first spin polarization layer is smaller than the thickness of the tunneling layer or 2 nm, whichever is smaller.

Since any tunneling magnetoresistive effect device is manufactured by a thin-film formation technique, the size and weight of the device can be sufficiently reduced. Also, as the thickness of the first spin polarization layer having a higher coercive force and a higher spin polarization rate than the soft magnetic layer, on which the first spin polarization layer is stacked, is adjusted so as to achieve both a low coercive force and a desirable TMR ratio, the sensitivity for a magnetic field can be sufficiently increased. The soft magnetic layer may be located either at the top or at the bottom of the device.

In the above tunneling magnetoresistive effect device, the thickness of the soft magnetic layer is 10 or more times greater than the total thickness of the tunneling layer and the first spin polarization layer.

With the thickness of the soft magnetic layer being 10 or more times greater than the total thickness of the tunneling layer and the first spin polarization layer, the TMR ratio can be further increased, and the coercive force of the device can be further reduced.

In the above tunneling magnetoresistive effect device, the area of a non-junction part of the soft magnetic layer is 10 or more times greater than a junction area through which tunnel current flows. The junction area is defined by the soft magnetic layer, the first spin polarization layer, and the tunneling layer.

With the area of the soft magnetic layer excluding the junction part being 10 or more times greater than the area of the tunnel-current flowing junction area, the coercive force of the device can be further increased, while the TMR ratio remains unchanged.

The above tunneling magnetoresistive effect device may further include a high permeability layer that is placed in the vicinity of the magnetism sensing unit, and is connected to the soft magnetic layer.

Since the high permeability layer connected to the soft magnetic layer is located in the vicinity of the magnetism sensing unit, the high permeability layer can function as a magnetic flux sink, and thus further increases the sensitivity of the device.

The above tunneling magnetoresistive effect device may further include a bulk magnetic member that is placed in the vicinity of the magnetism sensing unit.

The bulk magnetic member can achieve a much lower permeability and a much lower coercive force than a thin magnetic film. Also, the bulk magnetic member characteristically tolerates a large amount of magnetic flux. With this bulk magnetic member being located in the vicinity of the magnetism sensing unit, the sensitivity of the device can be further increased.

The above tunneling magnetoresistive effect device may alternatively include a bulk magnetic member that is placed on the high permeability layer.

As the bulk magnetic member is formed on the high permeability layer that is located in the vicinity of the magnetism sensing unit, the sensitivity of the device can be further increased.

In the above tunneling magnetoresistive effect device, the soft magnetic layer may have a lamination structure that has a plurality of soft magnetic films stacked on a non-magnetic layer.

As the soft magnetic layer is formed by the lamination structure that has a plurality of soft magnetic films stacked on a non-magnetic layer, the formation of reflux magnetic domains can be prevented. Accordingly, the device causes less noise and enables higher frequency operations (i.e., high-speed sampling operations). Thus, the device capacity can be further increased.

In the above tunneling magnetoresistive effect device, the soft magnetic layer may have a circular shape or a ring-like shape in a plan view.

As the soft magnetic layer has a circular (or oval) shape or a ring-like shape in a plan view, the magnetostatic energy can be sufficiently reduced. Accordingly, less magnetic charge is generated, and magnetic domains can be stabilized. As a result, the device has less noise, and achieves a higher sensitivity. In this manner, the device capacity can be further increased.

In the above tunneling magnetoresistive effect device, the soft magnetic layer may be formed by a plurality of divisional parts.

As each of the divisional parts is smaller than the whole soft magnetic layer, the formation of reflux magnetic domains can be restrained, and noise can be reduced. Also, matched anisotropies can be achieved, and the sensitivity of the device can be further increased.

In the above tunneling magnetoresistive effect device, the soft magnetic layer may have a plurality of notches formed therein.

As the soft magnetic layer is partitioned by the plurality of notches, the formation of reflux magnetic domains can be restrained by virtue of the small size of each divisional part of the soft magnetic layer. Also, noise can be reduced, and matched anisotropies can be achieved. Accordingly the sensitivity of the device can be further increased.

The above tunneling magnetoresistive effect device may further include a reset magnetic field generator for resetting the magnetized state of the magnetism sensing unit to a predetermined state.

Even if an incorrect sensing operation is conducted due to a temporary ferromagnetic field that magnetizes the magnetism sensing unit and shifts the operation point, the reset magnetic field generator resets the magnetized state of the magnetism sensing unit to the predetermined state. By doing so, the reset magnetic field generator enables a normal sensing operation after the resetting.

In the above tunneling magnetoresistive effect device, the reset magnetic field generator may include a reset electric current distributor that is integrally formed in the vicinity of the magnetism sensing unit.

With the reset electric current distributor being integrally formed in the vicinity of the magnetism sensing unit, the resetting operation described above can be more easily realized.

In the above tunneling magnetoresistive effect device, the reset magnetic field generator may alternatively include an external coil for generating a reset magnetic field in the magnetism sensing unit.

With the external coil that generates a reset magnetic field in the magnetism sensing unit, the resetting operation described above can be more easily realized.

The objects of the present invention are also achieved by a direction sensor system that includes: a plurality of tunneling magnetoresistive effect devices that are of any type described above, are independently arranged in the directions of three or more axial vectors, and sense geomagnetism; a sensing unit for sensing three or more axial vectors from sensor outputs of the plurality of tunneling magnetoresistive effect devices; an abnormality sensing unit for determining whether an abnormality exists in a sensed result by comparing the absolute value of each of the sensed results of the tunneling magnetoresistive effect devices with a predetermined threshold value; and an alarm unit for notifying that an abnormality exists in the sensed result, when the abnormality sensing unit senses the abnormality.

In this direction sensing system that senses geomagnetism, the three or more axial vectors are detected based on the sensor outputs of the tunneling magnetoresistive effect devices that are independently arranged in the directions of three or more axial vectors. Here, the absolute value of each of the sensor outputs of the tunneling magnetoresistive effect devices is compared with the threshold value that is defined by adding the measurement margin to the measured geomagnetism strength, so as to determine whether an abnormality exists in a sensed result. If an abnormality is detected, the alarm unit notifies the system user of the existence of the abnormality, so that the use of the incorrect sensed result can be prevented.

The objects of the present invention are also achieved by a direction sensor system that includes: a plurality of tunneling magnetoresistive effect devices that are of any of the above described types including a reset magnetic field generator for resetting the magnetized state of the magnetism sensing unit to a predetermined state, are independently arranged in the directions of three or more axial vectors, and sense geomagnetism; a sensing unit for sensing three or more axial vectors from sensor outputs of the plurality of tunneling magnetoresistive effect devices; an abnormality sensing unit for determining whether an abnormality exists in a sensed result by comparing the absolute value of each of the sensed results of the tunneling magnetoresistive effect devices with a predetermined threshold value; an alarm unit for notifying an abnormality exists in the sensed result, when the abnormality sensing unit senses the abnormality; and a resetting unit for providing reset electric current to the reset magnetic field generator so as to reset the magnetized state of the magnetism sensing unit to a predetermined state, when the abnormality sensing unit senses an abnormality.

If an abnormality is detected in a sensed result, the resetting unit provides reset electric current to the reset magnetic field generator, so as to reset the magnetized state of the magnetism sensing unit to the predetermined state. After this resetting operation, further incorrect sensing operations can be prevented.

The above and other objects and features of the present invention will become more apparent from the following description taken in conjunction with the accompanying drawings.

BRIEF DESCRIPTION OF THE DRAWINGS

FIG. 1A is a longitudinal section view of a substrate on which a soft magnetic layer is formed in a first embodiment of the present invention;

FIG. 1B is a longitudinal section view of the substrate on which the soft magnetic layer and a first spin polarization layer are formed;

FIG. 2A is a plan view of a pattern formed by the soft magnetic layer and the first spin polarization layer;

FIG. 2B is a longitudinal section view of the pattern formed by the soft magnetic layer and the first spin polarization layer;

FIG. 11 is a plan view of a measurement circuit used with the second embodiment;

DESCRIPTION OF THE PREFERRED EMBODIMENTS

Figure 3A:
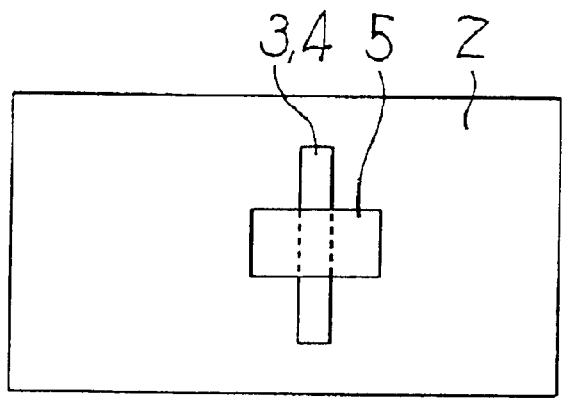
FIG. 3A is a plan view of a pattern formed by a tunneling layer stacked on the soft magnetic layer and the first spin polarization layer.

The following is a description of embodiments of the present invention, with reference to the accompanying drawings.

Referring first to FIGS. 1A through 9, a first embodiment of the present invention will be described below. A TMR device (a tunneling magnetoresistive effect device) 1 of this embodiment basically has a lamination structure having a predetermined pattern that consists of a soft magnetic layer 3 for assisting magnetic field sensing operations, a first spin polarization layer 4, a tunneling layer 5, and a second spin polarization layer 6, which are stacked in this order on an insulating substrate 2, as shown in FIGS. 4A and 4B. Tunnel current flows from the layers 3 and 4 to the layer 6 via the layer 5. The lamination consisting of the layers 3 through 6 constitute a magnetism sensing unit 7.

In the following, the structure of the above TMR device 1 and the production method will be described in more detail. As shown in FIG. 1A, a 0.1 $\mu$m-thick Fe20—Ni80 film having a magnetic composition is first formed as the soft magnetic layer 3 by a sputtering technique on the substrate 2 that is made of an insulating material such as quartz or glass, or covered with an insulating layer. The Fe20—Ni80 film is a magnetoresistive effect film. However, as the soft magnetic layer 3 for sensing a magnetic field, any other magnetic material having a lower spin polarization rate and a lower coercive force than the first spin polarization layer 4 may be employed instead of the Fe20—Ni80 film. Also, the Fe20—Ni80 film can be formed by a plating technique instead of a sputtering technique. Further, the thickness of the soft magnetic material 3 is not limited to 0.1 $\mu$m, but can be flexibly changed depending on essential factors such as sensitivity.

As shown in FIG. 1B, a Fe—Co50 film is formed as the first spin polarization layer 4 by a sputtering technique on the soft magnetic layer 3. As the spin polarization layer 4, any other material having a greater coercive force and a higher spin polarization rate than the soft magnetic layer 3 can be employed instead of the Fe—Co50 film.

Next, the soft magnetic layer 3 and the first spin polarization layer 4 are patterned as shown in FIGS. 2A and 2B by a photolithography technique and an Ar ion sealing technique that are commonly used in semiconductor production procedures. Here, the soft magnetic layer 3 and the first spin polarization layer 4 are formed into a linear pattern having a width of 10 $\mu$m and a length of 1 mm, which is designed to be able to function as a magnetoresistive effect device as well. However, the sizes and the shapes of the soft magnetic layer 3 and the first spin polarization layer 4 can be flexibly changed depending on the purpose of use. Also, a wet etching technique can be employed as the etching technique for the patterning. In such a case, aqua regia can be used as an etching liquid. Alternatively, an RIE (reactive ion etching) technique can be employed, if a suitable etching gas can be selected.

Figure 3B:
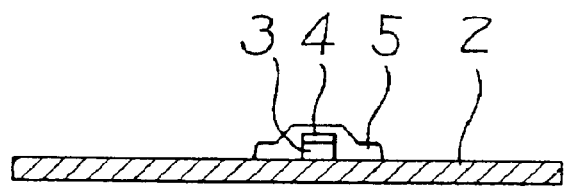
FIG. 3B is a longitudinal section view of the pattern formed by the tunneling layer stacked on the soft magnetic layer and the first spin polarization layer.

As shown in FIGS. 3A and 3B, an $Al_2O_3$ film is formed as the tunneling layer 5 by a sputtering technique on the patterned soft magnetic layer 3 and the first spin polarization layer 4. This film formation may be carried out by an EB (electron beam) technique or a CVD (chemical vapor deposition) technique. Like the soft magnetic layer 3 and the first spin polarization layer 4, the tunneling layer 5 is patterned by a common photolithography technique and a RIE technique using $CF_4+H_2$. Other insulating materials such as $SiO_2$ can function as the insulating material for the tunneling layer 5, but the $Al_2O_3$ film is more preferable for its characteristics. After the formation of Al, the film may be subjected to plasma oxidation in the atmosphere or a vacuum. A wet etching technique may be employed for etching the tunneling layer 5, but the back face of the substrate 2 needs to be protected by a resist if the substrate 2 is also subjected to the etching. Alternatively, the tunneling layer 5 may be formed by a dielectric material. In such a case, an Ar ion sealing technique can be employed for film processing.

The substrate 2 may be an insulating substrate made of a material other than quartz, or a flexible insulating substrate made of PET (polyethylene terephthalate) or polyimide. Depending on the designing rules, the film formation can be carried out using a metal mask from the beginning, without a procedure according to a photolithography technique.

Figure 4A:
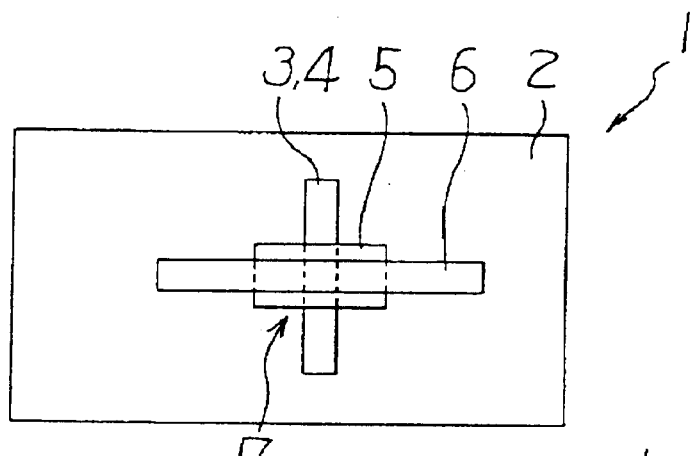
FIG. 4A is a plan view of a pattern formed by a second spin polarization layer stacked on the tunneling layer.
Figure 4B:
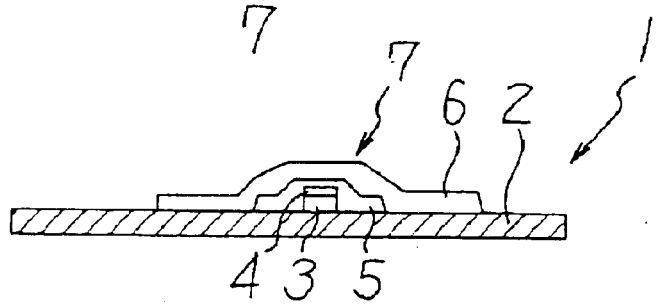
FIG. 4B is a longitudinal section view of the pattern formed by the second spin polarization layer stacked on the tunneling layer.

As shown in FIGS. 4A and 4B, a Fe—Co50 film is then formed as the second spin polarization layer 6 by a sputtering technique on the tunneling layer 5. Like the soft magnetic layer and the first spin polarization layer 4, the second spin polarization layer 6 is patterned by a photolithography technique. The pattern formed here is perpendicular to the pattern of the first spin polarization layer 4. The second spin polarization layer 6 may be formed by any material having a high spin polarization rate, or may even have an exchange interactive layer structure with another antiferromagnetic film i.e. a spin-valve structure.

Figure 5A:
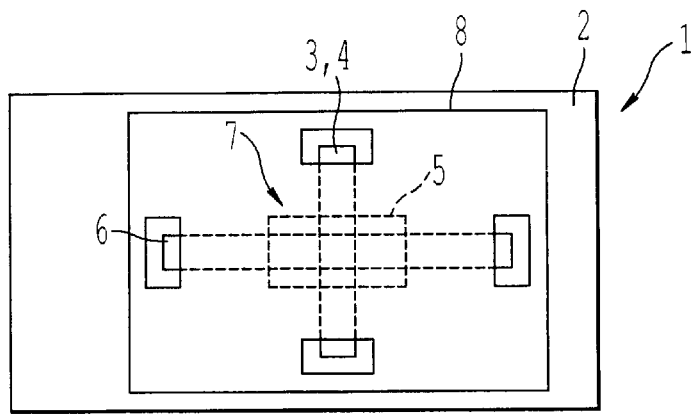
FIG. 5A is a plan view of a pattern formed by a protection layer stacked on the second spin polarization layer.
Figure 5B:
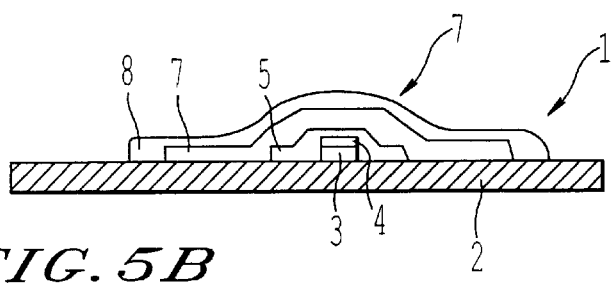
FIG. 5B is a longitudinal section view of the pattern formed by the protection layer stacked on the second spin polarization layer.

In this embodiment, a protection layer 8 made of an insulating material such as SiO2 may be added onto the second spin polarization film 6, as shown in FIGS. 5A and 5B.

In the TMR device 1 having the above structure, a method of detecting fluctuations of current with a minute electric current meter (not shown) is employed. Here, the current flows through the magnetism sensing unit 7 in a direction perpendicular to the film plane, with the first and second spin polarization layers 4 and 6 serving as electrodes. In this detecting method, an external magnetic field to be detected is generated in the magnetism detecting unit 7.

In this embodiment, a series of experiments were conducted on the TMR device 1, with the film thicknesses being parameters. As a result, preferable characteristics were confirmed.

MEASUREMENT EXAMPLE 1

Figure 6:
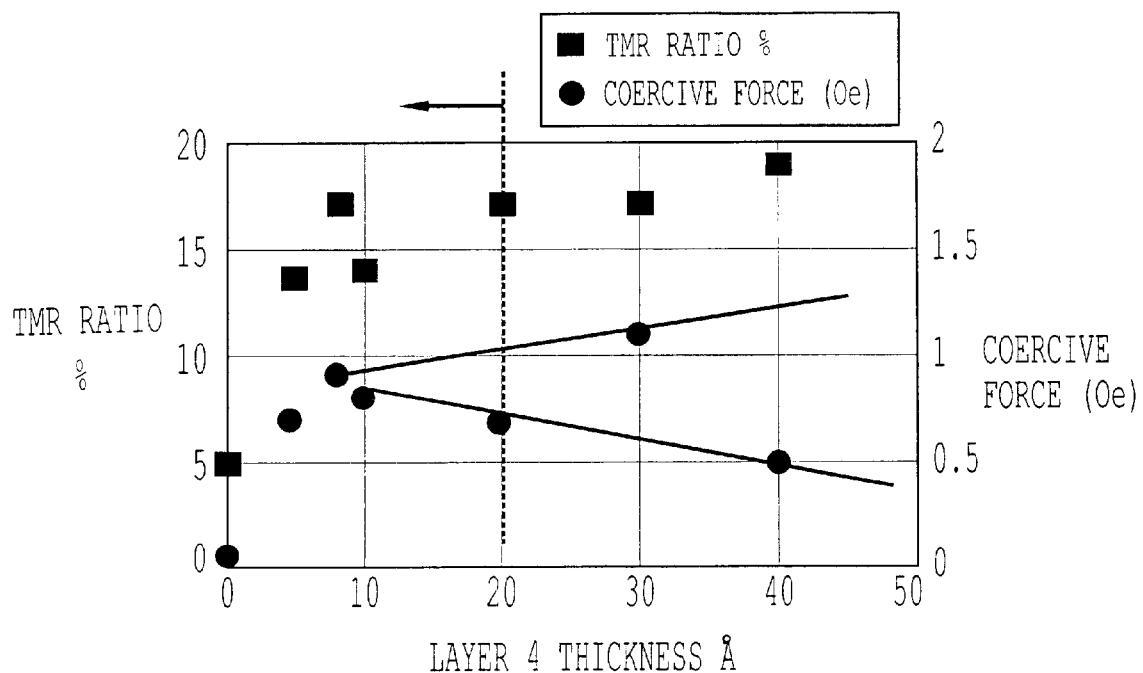
FIG. 6 shows the measurement results of experiments where the thickness of the first spin polarization layer is varied.

FIG. 6 shows the film-thickness dependence of the first spin polarization layer 4 in a case where the thickness of the tunneling layer 5 is 1.3 nm. As shown in FIG. 6, when the thickness of the first spin polarization layer 4 is smaller than 2 nm, there exists an area in which a low coercive force and a sufficient TMR ratio can be obtained. More specifically, the TMR ratio is substantially constant regardless of the thickness of the tunneling layer 5. However, if the thickness of the tunneling layer 5 increases to 2 nm or greater, the TMR ratio decreases, and the thickness of the first spin polarization layer 4 becomes smaller than 2 nm. On the other hand, if the thickness of the tunneling layer 5 reduces, the TMR ratio increases. Under these conditions, a low coercive force and a sufficient TMR ratio can be obtained when the thickness of the first spin polarization layer is smaller than 2 nm, which is smaller than the thickness of the tunneling layer 5.

MEASUREMENT EXAMPLE 2

Figure 7:
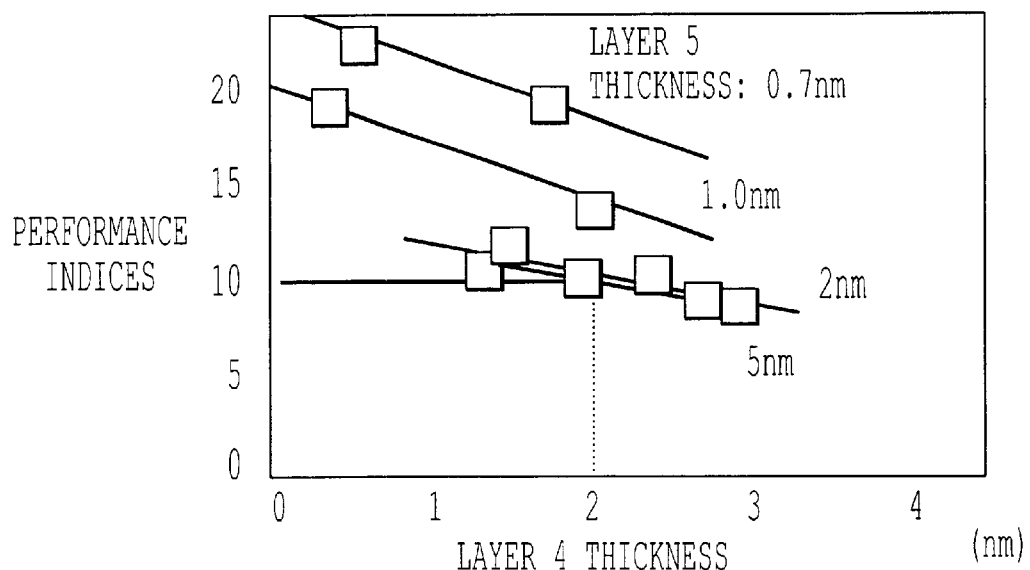
FIG. 7 shows the measurement results of experiments where the thickness of the first spin polarization layer is varied only when the thickness of the tunneling layer is thin.

The TMR ratio can be improved by further reducing the thickness of the tunneling layer 5. FIG. 7 shows improved data examples of performance indices that are the ratios of the TMR ratio (%) to coercive force (Oe) of the entire device.

According to the data examples, excellent characteristics can be obtained when the thickness of the first spin polarization layer 4 is smaller than the thickness of the tunneling layer 5 or 2 nm, whichever is smaller.

MEASUREMENT EXAMPLE 3

Figure 8:
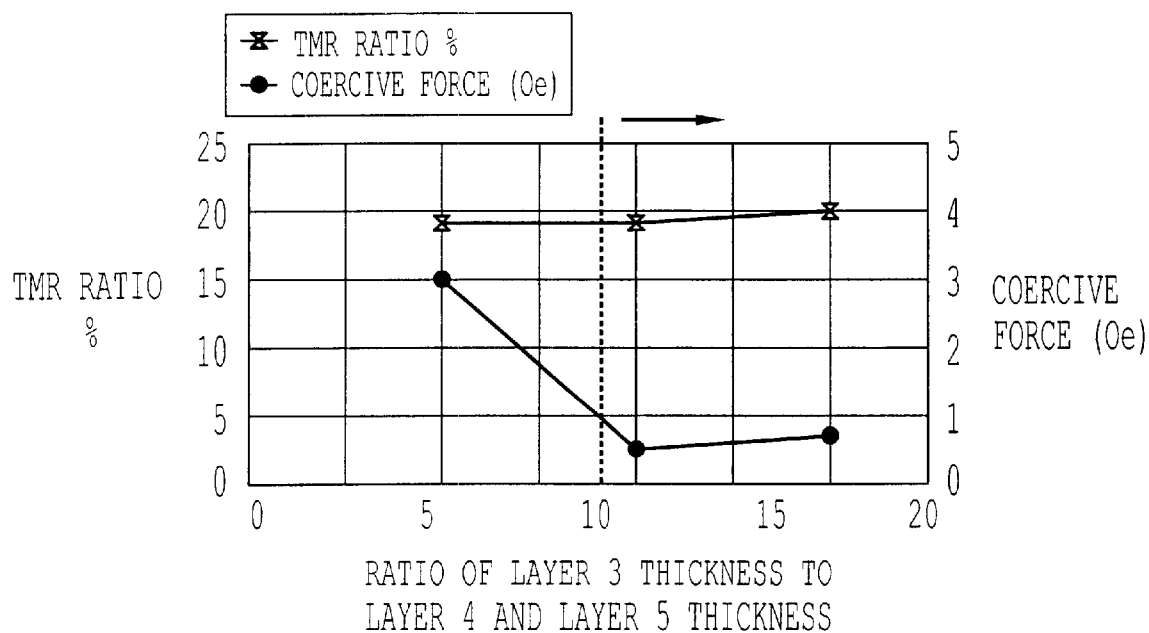
FIG. 8 shows the measurement results of experiments where the ratio of the thickness of the soft magnetic layer to the total thickness of the first spin polarization layer and the tunneling layer is varied.

FIG. 8 shows measurement results examples of sensor characteristics obtained in an experiment in which the ratio of the thickness of the soft magnetic layer 3 to the total thickness of the first spin polarization layer and the tunneling layer 5 in the TMR device 1 is varied.

The measurement results show that the TMR ratio can be increased and the coercive force can be further reduced by increasing the thickness of the soft magnetic layer 3 to a thickness 10 or more times greater than the thickness of the total thickness of the first spin polarization layer 4 and the tunneling layer 5.

MEASUREMENT EXAMPLE 4

Figure 9:
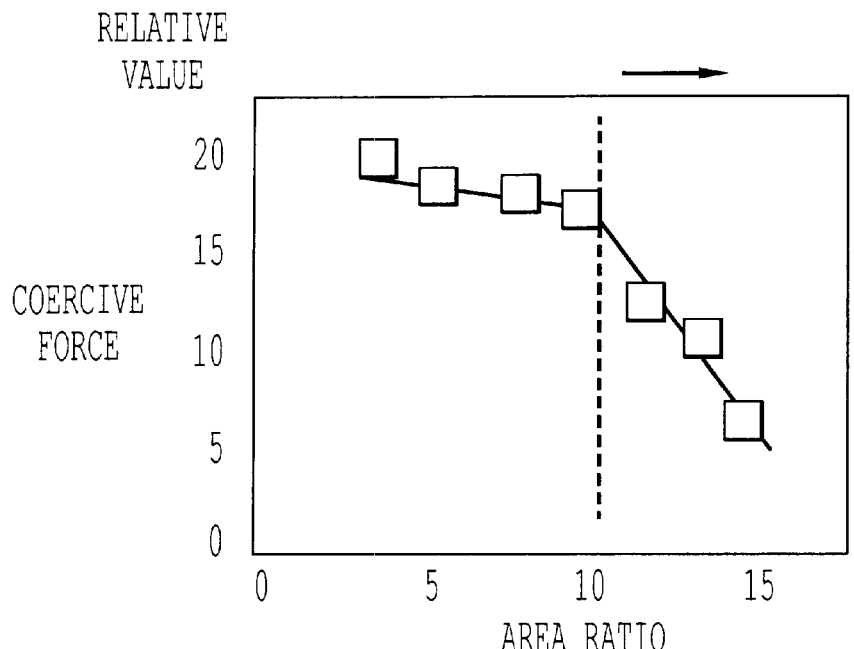
FIG. 9 shows the measurement results of experiments where the ratio of the junction area to the area of the soft magnetic layer is varied.

FIG. 9 shows measurement results examples of sensor characteristics obtained in an experiment in which the area of the soft magnetic layer 3 is varied in relation to the tunnel-current flowing junction area that is defined by the magnetism sensing unit 7. The area of the soft magnetic layer 3 does not affect the TMR ratio.

The measurement results show that, while the TMR ratio remain unchanged, the coercive force can be further reduced by increasing the area of the soft magnetic layer to an area 10 or more times greater than the tunnel-current flowing function area.

Since the TMR device 1 is manufactured by a thin-film formation technique, the size and weight of the device can be reduced. Also, the thickness of the first spin polarization layer 4 that is stacked on the soft magnetic layer 3 and has a higher coercive force and a higher spin polarization rate than the soft magnetic layer 3 is adjusted to such a thickness that can achieve both a low coercive force and a desirable TMR ratio. As a result, the magnet field sensitivity of the device as a sensor can be increased. If the small-sized and lightweight TMR device 1 having a high sensitivity is applied to a direction sensor system that will be described later, excellent effects can be expected.

Figure 10A:
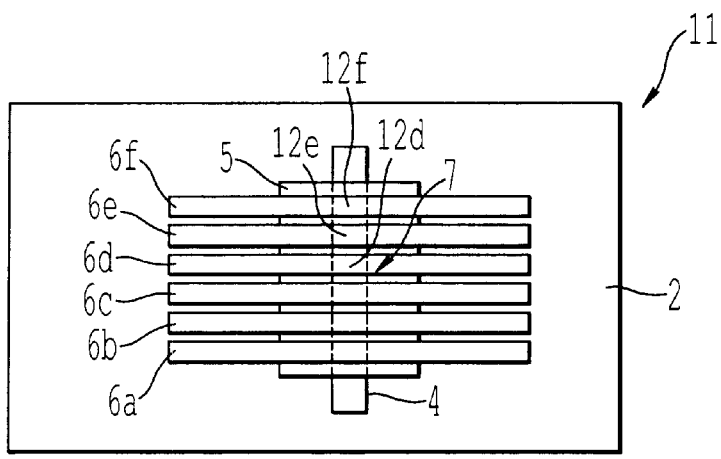
FIG. 10A is a plan view of a TMR device of a second embodiment in accordance with the present invention.
Figure 10B:
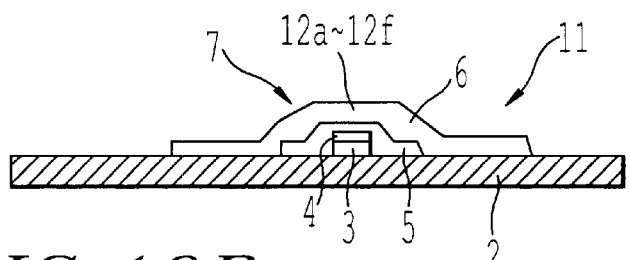
FIG. 10B is a longitudinal section view of the TMR device of the second embodiment in accordance with the present invention.

Referring now to FIGS. 10 and 11, a second embodiment of the present invention will be described. In the drawings, the same components as in the first embodiment are denoted by the same reference numerals, and explanation of those components will be omitted (the same applies to each embodiment hereafter).

In a TMR device 11 of this embodiment, the second spin polarization layer 6 of the first embodiment is divided into a plurality (six, for example) of layers that are arranged in parallel to one another and are denoted by 6a through 6f in FIG. 10A. In the magnetism sensing unit 7, the first polarization layer 4 forms an arrayed structure, crossing the plurality of second spin polarization layers 6a through 6f and serving as a common electrode. The tunneling layer 5 also forms an arrayed structure corresponding to the plurality of second polarization layers 6a through 6f. As a result, a TMR element is formed between the first polarization layer 4 and each of the second polarization layers 6a through 6f (as well as the tunneling layer 5).

To produce this TMR device 11, the film formation is carried out in the same manner as in the first embodiment. A patterning process using a photolithography technique is then carried out to divide a layer into the plurality of second polarization layers 6a through 6f (as well as the tunneling layer 5).

FIG. 11 shows an example of a sensor circuit structure for the TMR device 11. As shown in FIG. 11, a DC (direct current) power source 13 connects the first polarization layer 4 to the second polarization layers 6a through 6f, each of which also serves as an electrode. A switching circuit 14 connects a minute electric current meter 15 to each of the second polarization layers 6a through 6f. The switching circuit 14 performs a switching operation so as to accurately sense a change in magnetism of each of the second polarization layers 6a through 6f as a change in the TMR rate of each TMR element at each of sensing points 12a through 12f.

With the arrayed structure having the plurality of sensing points 12a through 12f, the TMR device 11 of this embodiment not only obtains the same effects as the first embodiment but also widens the purpose of use. In other words, the TMR device 11 is more practical.

Figure 12A:
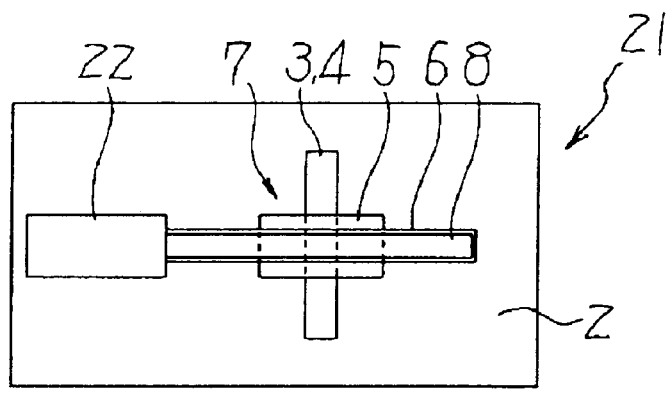
FIG. 12A is a plan view of a TMR device of a third embodiment in accordance with the present invention.
Figure 12B:
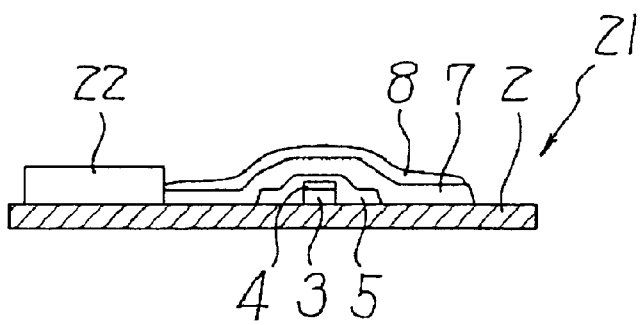
FIG. 12B is a longitudinal section view of the TMR device of the third embodiment in accordance with the present invention.

Referring now to FIGS. 12A and 12B, a third embodiment of the present invention will be described. A TMR device 21 of this embodiment has a high permeability layer 22 in the vicinity of the magnetism sensing unit 7. The high permeability layer 22 is formed by a sputtering technique, a CVD technique, a plating technique, or a sol-gel process technique. The permeability of the high permeability layer 22 is preferably 500 or higher, and should be formed by a CoZrNb film, a NiCoFe film, or a FeNi film. As a method of producing the high permeability layer 22, a photolithography technique, a mask deposition technique, or a cladding technique can be employed. In the complete state, the high permeability layer 22 is electrically connected to the soft magnetic layer 3 that is placed at the top or the bottom of the device.

In the TMR device 21 of this embodiment, the high permeability layer 22 functions as a magnetic flux sink, and further improves the sensitivity of the device.

Figure 13A:
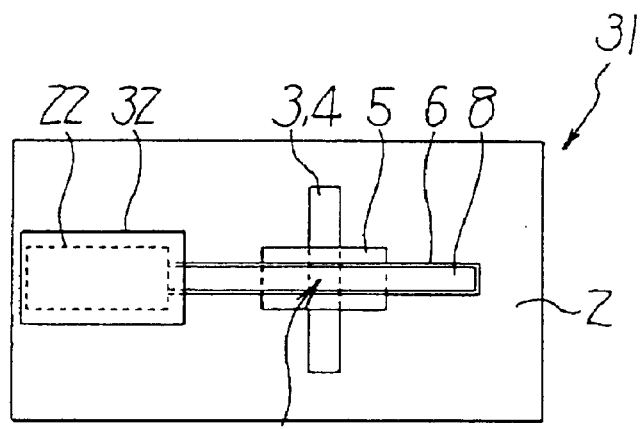
FIG. 13A is a plan view of a TMR device of a fourth embodiment in accordance with the present invention.
Figure 13B:
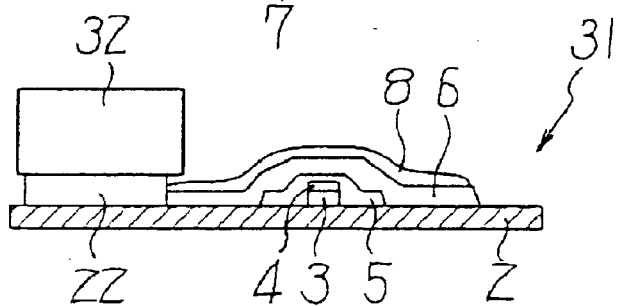
FIG. 13B is a longitudinal view of the TMR device of the fourth embodiment in accordance with the present invention.

Referring now to FIGS. 13A and 13B, a fourth embodiment of the present invention will be described. A TMR device of this embodiment has a bulk magnetic member 32 on the high permeability layer 22 that is located in the vicinity of the magnetism sensing unit 7. The bulk magnetic member 32 is formed by dicing a Mn—Zn ferrite block. However, the bulk magnetic member 32 is not limited to the diced Mn—Zn ferrite block.

Generally, a bulk magnetic member has a much lower permeability and coercive force than a magnetic thin film. Also, a bulk magnetic member can tolerate a large amount of magnetic flux, and therefore cannot be easily saturated. With the bulk magnetic member 32 formed on the high permeability layer 22, the TMR device 31 of this embodiment can have an even higher sensitivity.

It should be noted that the bulk magnetic member 32 is not necessarily formed on the high permeability layer 22, as long as being located in the vicinity of the magnetism sensing unit 7.

Figure 14:
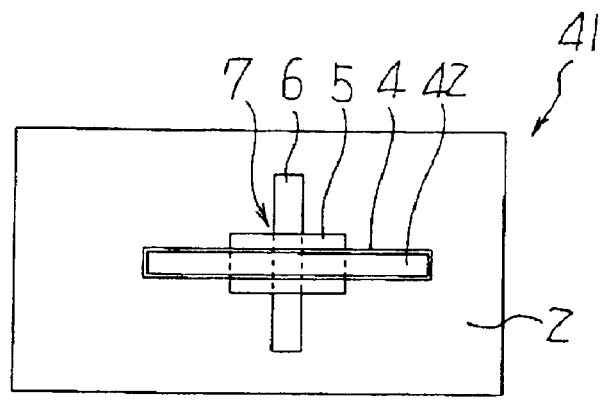
FIG. 14 is a plan view of a TMR device of a fifth embodiment in accordance with the present invention.

Referring now to FIG. 14, a fifth embodiment of the present invention will be described. A TMR device 41 of this embodiment has a soft magnetic layer 42 for assisting magnetic field sensing operations. The soft magnetic layer 42 is formed by a plurality of soft magnetic films (such as Co—Zr films or Fe—Ni films) that are stacked on a non-magnetic film (not shown) made of Ti, Ta, or $SiO_2$. It should be noted that FIG. 14 shows an example structure in which the layer stacking order is opposite from that in the foregoing embodiments (i.e., the soft magnetic layer 42 is located at the top of the device).

As the soft magnetic layer 42 is a lamination structure formed by the plurality of soft magnetic films stacked on a non-magnetic film, the formation of reflux magnetic domains can be avoided. Accordingly, the TMR device 41 of this embodiment causes less noise and enables higher frequency operations (i.e., high-speed sampling operations). Thus, further improved device functions can be expected from the TMR device 41 of this embodiment.

Figure 15:
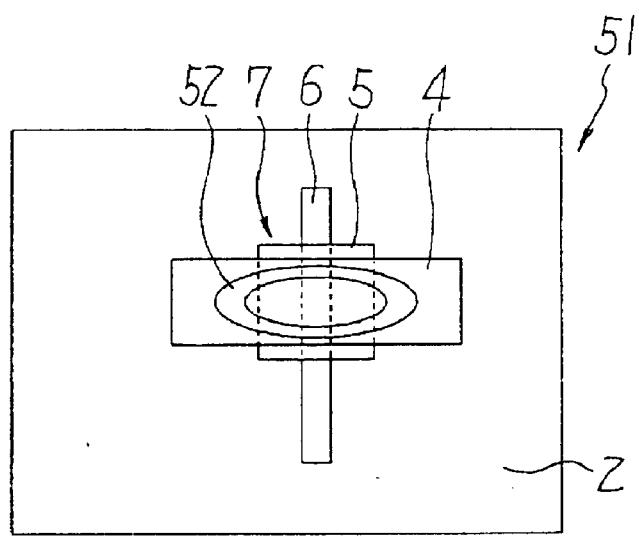
FIG. 15 is a plan view of a TMR device of a sixth embodiment in accordance with the present invention.

Referring now to FIG. 15, a sixth embodiment of the present invention will be described. A TMR device 51 of this embodiment has a soft magnetic layer 52 for assisting magnetic field sensing operations. This soft magnetic layer 52 has a ring-like shape in a plan view, and is formed by a Co—Zr—Nb film or a Fe—Ni film. In the example shown in FIG. 15, the stacking order is opposite from that of the foregoing embodiments (i.e., the soft magnetic layer 52 is located at the top of the device). The shape of the soft magnetic layer 52 is not limited to the ring-like shape, but may have a circular shape or an oval shape.

As the soft magnetic layer 52 has a ring-like shape in the TMR device 51, the magnetostatic energy can be reduced. Accordingly, less magnetic charge is generated, and magnetic domains are stabilized. As a result, the TMR device 51 has less noise, and achieves a higher sensitivity.

Figure 16:
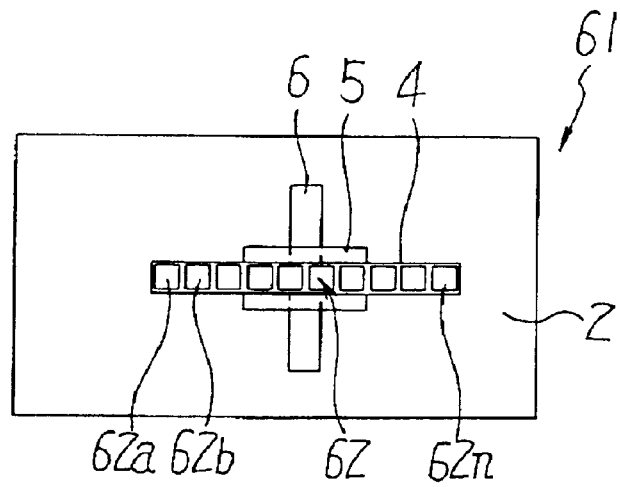
FIG. 16 is a plan view of a TMR device of a seventh embodiment in accordance with the present invention.

Referring now to FIG. 16, a seventh embodiment of the present invention will be described. A TMR device 61 of this embodiment has a soft magnetic layer 62 for assisting magnetic field sensing operation. The soft magnetic layer 62 is made up of a plurality of soft magnetic parts 62a through 62n that are arranged in the longitudinal direction. For example, the soft magnetic layer 62, which is formed by a Fe—Ni film, is divided into the soft magnetic parts 62a through 62n, each of which is 0.5 μm×0.5 μm in size. With the soft magnetic parts 62a through 62n of this size, the formation of reflux magnetic domains can be restrained, and a unit magnetic domain structure can be obtained. As a result, less noise is caused, and matched anisotropies can be easily achieved. Thus, the sensitivity of the device can be increased.

Figure 17:
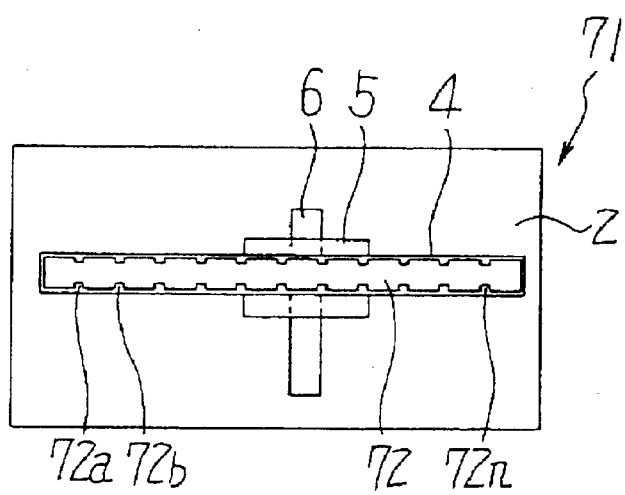
FIG. 17 is a plan view of a TMR device of a modification of the seventh embodiment.

The soft magnetic layer 62 is not limited to the divided structure shown in FIG. 16, but may have a divisional structure shown in FIG. 17. The soft magnetic layer 72 of a TMR device 71 shown in FIG. 17 has a plurality of notches 72a through 72n formed therein in the longitudinal direction. With this structure, the formation of reflux magnetic domains can be sufficiently restrained, and less noise is caused.

Figure 18:
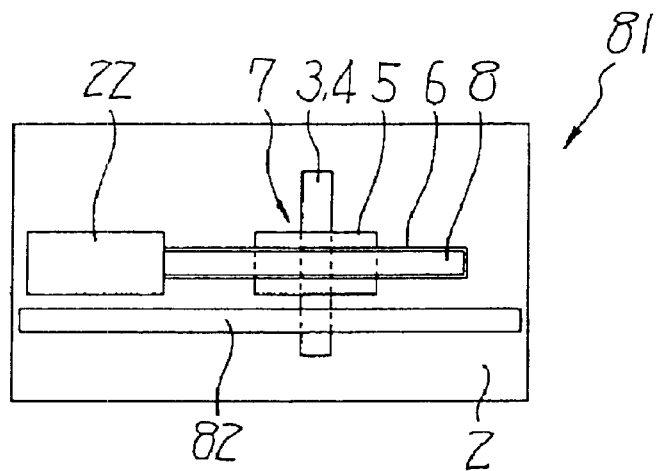
FIG. 18 is a plan view of a TMR device of an eighth embodiment in accordance with the present invention.

Referring now to FIG. 18, an eighth embodiment of the present invention will be described. A TMR device 81 of this embodiment has the same structure as the TMR device 21 shown in FIG. 12, except that a reset electric current distributor 82 is provided in the vicinity of the magnetism sensing unit 7 and the high permeability layer 22. The reset electric current distributor 82 serves as a reset magnetic field generator for the magnetized state of each of the magnetic layers of the magnetism sensing unit 7 to a predetermined state, such as the initial state. The reset electric current distributor 82 extends along the total length of the magnetism sensing unit 7 and the high permeability layer 22.

With the TMR 81 having this structure, if an abnormality is detected in a measured value by a direction sensor system that will be described later, the reset electric current distributor 82 provides reset electric current to reset the magnetized state of each layer of the magnetism sensing unit 7 to the initial state. By doing so, a normal sensing operation can be conducted after the resetting. More specifically, a shift of an operation point caused by the magnetization of the magnetism sensing unit 7 due to a temporary ferromagnetic field can be easily canceled, and after the canceling, a normal sensing operation can be carried out. Accordingly, this TMR device 81 is desirable not only for a direction sensor system for sensing geomagnetism describer later, but also for a regular magnetism sensor.

A reset magnetic field generator is not limited to the reset electric current distributor 82 that is integrally formed on the device. For instance, an external coil 83 that generates a reset magnetic field through the TMR device 81 can be employed, as shown in FIG. 19.

Figure 20:
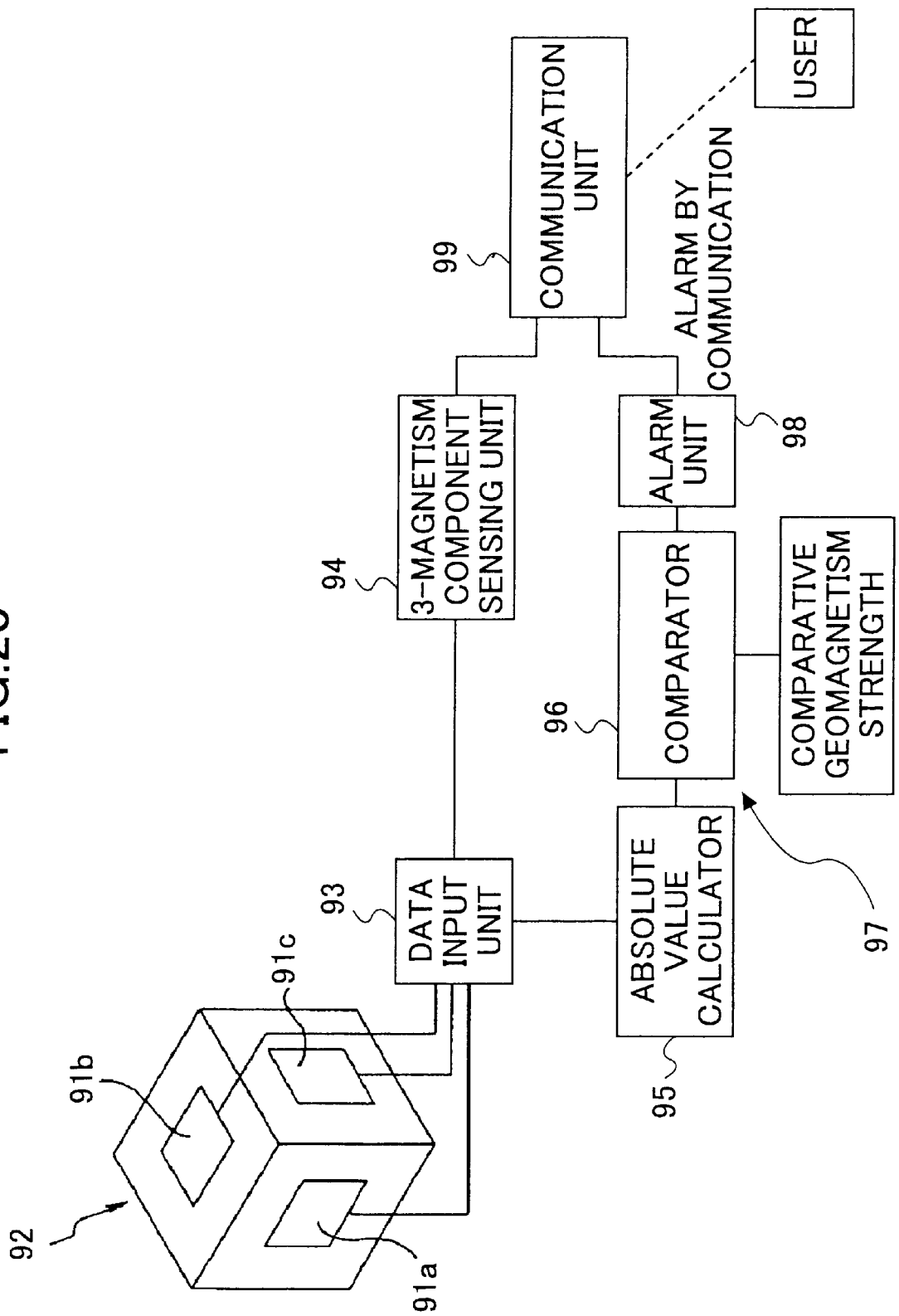
FIG. 20 illustrates a direction sensor system of a ninth embodiment in accordance with the present invention.

Referring now to FIG. 20, a ninth embodiment of the present invention will be described. This embodiment is an example of a direction sensor system that uses any of the TMR devices of the foregoing embodiments of the present invention, and senses geomagnetism. The direction system includes a geomagnetism sensor 92 that has three TMR devices 91*a*, 91*b*, and 91*c* (which are of any type of the foregoing embodiments, i.e., the TMR devices 1, 11, 21, 31, 41, 51, 61, 71, and 81) independently arranged in the directions of the three axial vectors of x, y, and z. The sensor outputs of the TMR devices 91*a*, 91*b*, and 91*c* are input into a three magnetism component sensing unit 94 as a sensor via a data input unit 93. The three magnetism component sensing unit 94 senses the three axial vector components, based on the sensor outputs of the TMR devices 91*a*, 91*b*, and 91*c*. An absolute value calculator 95 that calculates the absolute value of each of the sensor outputs of the TMR devices 91*a*, 91*b*, and 91*c* that are input via the data input unit 93. A comparator 96 compares each of the absolute values obtained from the absolute value calculator 95 with a threshold value that is defined by adding a measurement margin to a predetermined comparison geomagnetism strength. The absolute value calculator 95 and the comparator 96 constitute an abnormality sensing unit 97. If a calculated absolute value is greater than the threshold value, the comparator 96 determines that an abnormality exists in the sensed result. An alarm unit 98 that operates based on the abnormality sensor output is provided at the output side of the comparator 96.

In the direction sensor system of this embodiment, if a sensed result that is greater than the threshold predetermined by adding a measurement margin to a measured geomagnetism strength, the alarm unit 98 notifies that there is an abnormality in the measurement value, and thus prevents the use of the incorrect sensed result. It is more practical to transmit the output of the alarm unit 98 to the user of the system via a communication unit 99, as well as the sensed result obtained from the three magnetism component sensing unit 94.

Figure 19:
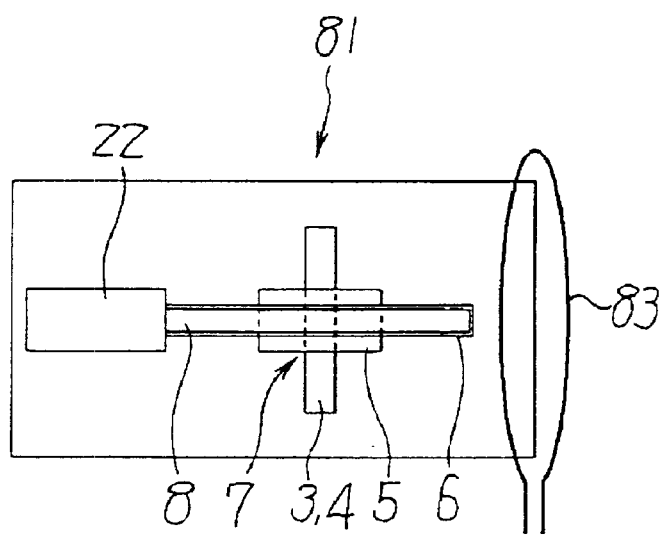
FIG. 19 is a plan view of the TMR device of a modification of the eighth embodiment.

In the construction of this system, it is more preferable to employ the TMR device 81 shown in FIG. 18 or 19 for the three TMR devices 91*a*, 91*b*, and 91*c*, so as to perform normal magnetism sensing operations after a reset operation. If the comparator 6 detects an abnormality in a sensed result, the reset electric current distributor 82 or the external coil 83 helps a resetting unit (not shown) to provide reset electric current so as to reset the magnetized state of the magnetism sensing unit 7 to the initial state. In this manner, normal geomagnetism sensing operations can be performed after a reset operation.

Although the three TMR devices 91*a*, 91*b*, and 91*c* are employed in the direction sensor system of this embodiment, more than three TMR devices that are independently arranged in the directions of more than three axial vectors can be employed to sense the direction of geomagnetism as more than three axial vectors.

It should be noted that the present invention is not limited to the embodiments specifically disclosed above, but other variations and modifications may be made without departing from the scope of the present invention.

What is claimed is:

1. A tunneling magnetoresistive effect device comprising:
   a soft magnetic layer for assisting magnetic field sensing operations, the soft magnetic layer being stacked on a surface of a substrate;
   a first spin polarization layer that is stacked on the soft magnetic layer, and has a higher coercive force and a higher spin polarization rate than the soft magnetic layer;
   a tunneling layer that covers the soft magnetic layer and the first spin polarization layer, and is made of an insulating material or a dielectric material; and
   a second spin polarization layer that is stacked on the tunneling layer,
   wherein
      a magnetism sensing unit is formed by the lamination structure comprising the soft magnetic layer, the first spin polarization layer, the tunneling layer, and the second spin polarization layer, and
      a thickness of the first spin polarization layer is smaller than either a thickness of the tunneling layer or 2 nm.

2. The tunneling magnetoresistive effect device as claimed in claim 1, wherein the thickness of the soft magnetic layer is 10 or more times greater than the total thickness of the tunneling layer and the first spin polarization layer.

3. The tunneling magnetoresistive effect device as claimed in claim 1, wherein the area of a non-junction part of the soft magnetic layer is 10 or more times greater than a junction area through which tunnel current flows, the junction area being defined by the soft magnetic layer, the first spin polarization layer, and the tunneling layer.

4. The tunneling magnetoresistive effect device as claimed in claim 1, further comprising a high permeability layer that is placed in the vicinity of the magnetism sensing unit, and is connected to the soft magnetic layer.

5. The tunneling magnetoresistive effect device as claimed in claim 1, further comprising a bulk magnetic member that is placed in the vicinity of the magnetism sensing unit.

6. The tunneling magnetoresistive effect device as claimed in claim 4, further comprising a bulk magnetic member that is placed on the high permeability layer.

7. The tunneling magnetoresistive effect device as claimed in claim 1, wherein the soft magnetic layer has a lamination structure that has a plurality of soft magnetic films stacked on a non-magnetic layer.

8. The tunneling magnetoresistive effect device as claimed in claim 1, wherein the soft magnetic layer has a circular shape or a ring-like shape in a plan view.

9. The tunneling magnetoresistive effect device as claimed in claim 1, wherein the soft magnetic layer is formed by a plurality of divisional parts.

10. The tunneling magnetoresistive effect device as claimed in claim 1, wherein the soft magnetic layer has a plurality of notches formed therein.

11. The tunneling magnetoresistive effect device as claimed in claim 1, further comprising a reset magnetic field generator for resetting a magnetized state of the magnetism sensing unit to a predetermined state.

12. The tunneling magnetoresistive effect device as claimed in claim 11, wherein the reset magnetic field generator includes a reset electric current distributor that is integrally formed in the vicinity of the magnetism sensing unit.

13. The tunneling magnetoresistive effect device as claimed in claim 11, wherein the reset magnetic field generator includes an external coil for generating a reset magnetic field in the magnetism sensing unit.

14. A direction sensor system comprising:
a plurality of tunneling magnetoresistive effect devices that are independently arranged in the directions of three or more axial vectors, and sense geomagnetism, each of the tunneling magnetoresistive effect device including: a soft magnetic layer for assisting magnetic field sensing operations, the soft magnetic layer being stacked on a substrate; a first spin polarization layer that is stacked on the soft magnetic layer, and has a higher coercive force and a higher spin polarization rate than the soft magnetic layer; a tunneling layer that covers the soft magnetic layer and the first spin polarization layer, and is made of an insulating material or a dielectric material; and a second spin polarization layer that is stacked on the tunneling layer, a magnetism sensing unit being formed by the lamination structure that comprises the soft magnetic layer, the first spin polarization layer, the tunneling layer, and the second spin polarization layer, and a thickness of the first spin polarization layer being smaller than either a thickness of the tunneling layer or 2 nm;

a sensing unit for sensing three or more axial vectors from sensor outputs of the plurality of tunneling magnetoresistive effect devices;

an abnormality sensing unit for determining whether an abnormality exists in a sensed result by comparing the absolute value of each of the sensed results of the tunneling magnetoresistive effect devices with a predetermined threshold value; and an alarm unit for notifying that an abnormality exists in the sensed result, when the abnormality sensing unit senses the abnormality.

15. A direction sensor system comprising:
a plurality of tunneling magnetoresistive effect devices that are independently arranged in the directions of three or more axial vectors, and sense geomagnetism, each of the tunneling magnetoresistive effect devices including: a soft magnetic layer for assisting magnetic field sensing operations, the soft magnetic layer being stacked on the substrate; a first spin polarization layer that is stacked on the soft magnetic layer, and has a higher coercive force and a higher spin polarization rate than the soft magnetic layer; a tunneling layer that covers the soft magnetic layer and the first spin polarization layer, and is made of an insulating material or a dielectric material; a second spin polarization layer that is stacked on the tunneling layer; and a reset magnetic field generator for resetting a magnetized state of the magnetism sensing unit to a predetermined state, a magnetism sensing unit being formed by the lamination structure that comprises the soft magnetic layer, the first spin polarization layer, the tunneling layer, and the second spin polarization layer, and a thickness of the first spin polarization layer being smaller than either a thickness of the tunneling layer or 2 nm;

a sensing unit for sensing three of more axial vectors from sensor outputs of the plurality of tunneling magnetoresistive effect devices, an abnormality sensing unit for determining whether an abnormality exists in a sensed result by comparing the absolute value of each of the sensed results of the tunneling magnetoresistive effect devices with a predetermined threshold value, an alarm unit for notifying that an abnormality exists in the sensed result, when the abnormality sensing unit senses the abnormality; and a resetting unit to reset electric current to the reset magnification field generator so as to reset the magnetized state of the magnetism sensing unit to a predetermined state, when the abnormality sensing unit senses an abnormality.

* * * * *